(12) United States Patent
Shoki et al.

(10) Patent No.: US 9,229,316 B2
(45) Date of Patent: Jan. 5, 2016

(54) METHOD FOR PRODUCING SUBSTRATE WITH MULTILAYER REFLECTIVE FILM, METHOD FOR PRODUCING REFLECTIVE MASK BLANK AND METHOD FOR PRODUCING REFLECTIVE MASK

(71) Applicant: HOYA CORPORATION, Shinjuku-ku, Tokyo (JP)

(72) Inventors: Tsutomu Shoki, Shinjuku-ku (JP); Kazuhiro Hamamoto, Shinjuku-ku (JP)

(73) Assignee: HOYA CORPORATION, Tokyo (JP)

( * ) Notice: Subject to any disclaimer, the term of this patent is extended or adjusted under 35 U.S.C. 154(b) by 0 days.

(21) Appl. No.: 14/369,414

(22) PCT Filed: Mar. 21, 2013

(86) PCT No.: PCT/JP2013/057950
§ 371 (c)(1),
(2) Date: Jun. 27, 2014

(87) PCT Pub. No.: WO2013/146488
PCT Pub. Date: Oct. 3, 2013

(65) Prior Publication Data
US 2015/0079501 A1  Mar. 19, 2015

(30) Foreign Application Priority Data

Mar. 28, 2012 (JP) .................................. 2012-073220

(51) Int. Cl.
*G03F 1/24* (2012.01)
*G03F 1/42* (2012.01)

(52) U.S. Cl.
CPC ... *G03F 1/42* (2013.01); *G03F 1/24* (2013.01)

(58) Field of Classification Search
CPC ..................................... G03F 1/24; G03F 1/42
USPC .............................................................. 430/5
See application file for complete search history.

(56) References Cited

U.S. PATENT DOCUMENTS

2011/0287219 A1  11/2011  Matsui et al.

FOREIGN PATENT DOCUMENTS

| JP | 7-27198 B2 | 3/1995 |
|---|---|---|
| JP | 2002-217097 A | 8/2002 |
| JP | 2005-077845 A | 3/2005 |
| JP | 2010-272553 A | 12/2010 |
| JP | 2011-077480 A | 4/2011 |
| JP | 2012-009833 A | 1/2012 |
| WO | 2008/129914 A1 | 10/2008 |

OTHER PUBLICATIONS

International Search Report for PCT/JP2013/057950 dated Jun. 11, 2013.

*Primary Examiner* — Christopher Young
(74) *Attorney, Agent, or Firm* — Sughrue Mion, PLLC

(57) ABSTRACT

Disclosed is a method for producing a substrate with a multilayer reflective film for EUV lithography including a multilayer reflective film disposed on a principal surface of a substrate, the method including a multilayer reflective film formation step of forming the multilayer reflective film on the principal surface of the substrate in such a manner that the multilayer reflective film has a slope region in which the film thickness is decreased in a direction from the inside to the outside of the substrate on a peripheral portion of the principal surface, and a fiducial mark formation step of forming fiducial marks in the slope region by removing at least a portion of the multilayer reflective film, the fiducial marks serving as references for a defective location indicated by defect information with respect to the surface of the substrate with the multilayer reflective film.

21 Claims, 6 Drawing Sheets

METHOD FOR PRODUCING SUBSTRATE WITH MULTILAYER REFLECTIVE FILM, METHOD FOR PRODUCING REFLECTIVE MASK BLANK AND METHOD FOR PRODUCING REFLECTIVE MASK

CROSS REFERENCE TO RELATED APPLICATIONS

This application is a National Stage of International Application No. PCT/JP2013/057950 filed Mar. 21, 2013, claiming priority based on Japanese Patent Application No. 2012-073220, filed Mar. 28, 2012, the contents of all of which are incorporated herein by reference in their entirety.

TECHNICAL FIELD

The present invention relates to methods for producing a substrate with a multilayer reflective film, reflective mask blanks and reflective masks for EUV lithography used in, for example, the manufacturing of semiconductor devices.

BACKGROUND ART

Extreme ultra violet (hereinafter, EUV) lithography is an exposure technique utilizing EUV light and has a potential in application in the semiconductor industry which has recently pursued the manufacturing of semiconductor devices with finer designs. Here, the term "EUV light" indicates light having wavelengths in the soft X-ray region or the vacuum UV region, specifically, wavelengths of about 0.2 to 100 nm. For example, Patent Literature 1 proposes a reflective mask for exposure as a mask used in the EUV lithography.

In the reflective mask described in Patent Literature 1, a multilayer reflective film capable of reflecting exposure light is disposed on a substrate, and a pattern of an absorber film capable of absorbing the exposure light is disposed on the multilayer reflective film. The light incident on the reflective mask mounted on an exposure apparatus (a pattern transfer apparatus) is partly absorbed by the absorber film and is partly reflected by the multilayer reflective film exposed from the absorber film. The light reflected by the portions exposed from the absorber film is transferred onto a semiconductor substrate via a reflective optical system.

Patent Literature 2 describes a mask blank defect inspection method including a step of applying EUV light from a light source to a prescribed inspection region of a mask blank. Further, Patent Literature 2 describes that recesses with a narrow width are formed beforehand by a method such as a focused ion beam (FIB) process in portions of the surface of a mask substrate (a super smooth substrate) for constituting the mask blank, and a multilayer film is deposited over the recesses for forming fiducial marks.

Patent Literature 3 describes a reflective mask blank substrate for EUV lithography characterized in that at least three marks satisfying prescribed conditions are disposed on a film-production surface of the substrate. The prescribed conditions are (1) that the size of the marks is 30 to 100 nm in terms of circular equivalent diameter and (2) that three of the marks on the film-production surface are not on the same virtual straight line. Further, Patent Literature 3 describes that the prescribed marks are formed by a lithography process.

CITATION LIST

Patent Literature

Patent Literature 1: JP-B-H7-27198
Patent Literature 2: JP-A-2010-272553
Patent Literature 3: WO 2008/129914

SUMMARY OF INVENTION

In recent years, transfer masks such as reflective masks are required to meet a very high level of pattern position accuracy. Because, in particular, reflective masks for EUV lithography (also written simply as "reflective masks") are used for the purpose of the formation of much finer patterns than by the conventional techniques, there are even stricter requirements on the level of pattern position accuracy and also on the acceptable level of defects in reflective mask blanks for EUV lithography that are precursors of reflective masks (hereinafter, also written simply as "reflective mask blanks"). For example, reflective mask blanks are demanded to be free from defects that are approximately 30 nm or more in terms of circular equivalent diameter in the case of lithography technique for the manufacturing of semiconductor devices having half pitches of 32 nm or less.

However, it is extremely difficult to produce reflective mask blanks that are perfectly free from defects with a size of 30 nm in terms of circular equivalent diameter. Thus, methods have been proposed for correcting defects in reflective mask blanks. One of such defect correction methods is local application of laser light or electron beam. Further, techniques for remedying defects are proposed in which defective locations in a reflective mask blank are detected and a pattern correction is performed during the production of a reflective mask such that the positions of the defects will coincide with the position of a pattern defined by an absorber film.

For the defect correction or the pattern correction for reflective mask blanks, accurate grasping of the positions of defects is necessary. For this purpose, reflective mask blanks or substrate with a multilayer reflective film used in the production of reflective mask blanks are sometimes provided with fiducial marks that serve as the references in the measurement of defective locations. Specific examples of the fiducial marks are illustrated in FIGS. 6(a) and (b). For example, the fiducial mark shown in FIG. 6(a) is composed of a fine mark 82 with a size of several μm×several μm (for example, 5 μm×5 μm) and auxiliary marks 84 (with a size of several μm×several tens of μm, for example, 1 μm×200 μm) that are arranged outside the fine mark 82 and assist in the detection of the position of the fine mark 82. Such fiducial marks may be formed by, for example, removing portions of a multilayer reflective film in the workpiece such as a reflective mask blank by etching or with focused ion beam.

When, for example, a multilayer reflective film in a reflective mask blank or a substrate with a multilayer reflective film is processed with focused ion beam to form fiducial marks, the processing through all the layers in the multilayer reflective film takes approximately 1 hour per location. For example, the formation of fiducial marks will take 3 hours when fiducial marks are formed at 3 locations in the single workpiece such as a reflective mask blank.

If fiducial marks are formed in such a manner that the multilayer reflective film is not processed through all the layers but approximately to the half of its thickness in an attempt to reduce the processing time, the time is half, 1.5 hours in the formation of fiducial marks at 3 locations in the single workpiece such as a reflective mask blank. In this case, however, sufficient contrast cannot be obtained when the fiducial marks in the reflective mask blank are detected with defect inspection light or electron beam. As a result, the accuracy in the determination of the positions of defects cannot be ensured.

The present invention has been made under these circumstances. It is therefore an object of the invention to provide methods for producing a substrate with a multilayer reflective film and reflective mask blanks which can produce fiducial marks in the substrate with the multilayer reflective film and the reflective mask blanks in a short time while ensuring that the fiducial marks will attain sufficient contrast when the fiducial marks are detected with defect inspection light and electron beam.

To achieve the above object, the present invention has the following configurations. An aspect of the present invention resides in methods for producing a substrate with a multilayer reflective film for EUV lithography (also written simply as "a substrate with a multilayer reflective film") characterized by the following configurations 1 to 8.

(Configuration 1)

The configuration 1 of the present invention resides in a method for producing a substrate with a multilayer reflective film for EUV lithography, the substrate with a multilayer reflective film including a multilayer reflective film disposed on a principal surface of a substrate, the multilayer reflective film including higher refractive index layers and lower refractive index layers alternately stacked on top of one another, the method including a multilayer reflective film formation step of forming the multilayer reflective film on the principal surface of the substrate in such a manner that the multilayer reflective film has a slope region in which the film thickness is decreased in a direction from the inside to the outside of the substrate on a peripheral portion of the principal surface, and a fiducial mark formation step of forming fiducial marks in the slope region by removing at least a portion of the multilayer reflective film, the fiducial marks serving as references for a defective location indicated by defect information with respect to the surface of the substrate with a multilayer reflective film.

The substrate with a multilayer reflective film of the invention has a slope region on a peripheral portion of the principal surface of the substrate. In the slope region, the thickness of the multilayer reflective film is decreased in a direction from the inside to the outside of the substrate. The fiducial marks are formed in the slope region of the multilayer reflective film in which the film thickness is small. Consequently, the time required for the formation of the fiducial marks can be reduced. Further, the fiducial marks thus formed advantageously attain a vertical cross section and also achieve good alignment accuracy.

(Configuration 2)

The configuration 2 of the present invention resides in the method for producing substrate with a multilayer reflective film according to the configuration 1 characterized in that the fiducial marks are formed in the fiducial mark formation step by removing at least a portion of the multilayer reflective film by etching or with focused ion beam. The use of etching or focused ion beam makes it possible to reliably remove the multilayer reflective film for forming a desired shape of the fiducial marks.

(Configuration 3)

The configuration 3 of the present invention resides in the method for producing substrate with a multilayer reflective film according to the configuration 1 or 2 characterized in that, in the multilayer reflective film formation step, the higher refractive index layers and the lower refractive index layers are formed by a sputtering method such that a shielding member is disposed apart from the peripheral portion, and the higher refractive index layers and the lower refractive index layers are deposited at an angle relative to the normal to the principal surface of the substrate. The shielding member prevents the sputtered particles from being deposited on the peripheral portion of the substrate. Thus, the slope region may be easily and reliably formed in the multilayer reflective film by providing the shielding member apart from the peripheral portion.

(Configuration 4)

The configuration 4 of the present invention resides in the method for producing substrate with a multilayer reflective film according to any one of the configurations 1 to 3 characterized in that the multilayer reflective film is formed by an ion beam sputtering method. By an ion beam sputtering method, the cycles of the higher refractive index layers and the lower refractive index layers may be formed with desired thicknesses and with good reproducibility.

(Configuration 5)

The configuration 5 of the present invention resides in the method for producing substrate with a multilayer reflective film according to the configuration 4 characterized in that particles for the lower refractive index layers are sputtered with a larger incident angle relative to the normal to the principal surface of the substrate compared to an incident angle of particles sputtered for the higher refractive index layers. According to this configuration, the production method can suppress the diffusion of the lower refractive index materials to the higher refractive index layers and thus can suppress the formation of metal diffusion layers. Consequently, it is possible to suppress a decrease in the reflectance of the multilayer reflective film due to the formation of metal diffusion layers. Further, the multilayer reflective film fabricated in the above manner can be processed at a higher rate with focused ion beam or by etching for the formation of fiducial marks. The reason for this is because the slope region in the multilayer reflective film contains a larger proportion of the lower refractive index materials, namely, metals, alloys or compounds thereof that exhibit a high etching rate in the etching with the focused ion beam or the etchant in a fluorine-containing gas.

(Configuration 6)

The configuration 6 of the present invention resides in the method for producing substrate with a multilayer reflective film according to the configuration 4 characterized in that the multilayer reflective film is a periodic stack in which molybdenum (Mo) films and silicon (Si) films are stacked alternately on top of one another and in that particles for the Mo films are sputtered with a larger incident angle relative to the normal to the principal surface of the substrate compared to an incident angle of particles sputtered for the Si films. The periodic stack in which thin films of silicon (Si) and molybdenum (Mo) are stacked alternately on top of one another may be suitably used as a multilayer reflective film 12 configured to reflect EUV light in the soft X-ray region with a wavelength of about 12 to 14 nm.

(Configuration 7)

The configuration 7 of the present invention resides in the method for producing substrate with a multilayer reflective film according to any one of the configurations 1 to 6 characterized in that the method includes a protective film formation step of forming a protective film on the multilayer reflective film. The protective film disposed on the multilayer reflective film prevents damages to the multilayer reflective film not only during the formation of a pattern of an absorber film but also during pattern correction. As a result, the reflectance of the multilayer reflective film may be maintained at a high value.

(Configuration 8)

The configuration 8 of the present invention resides in the method for producing substrate with a multilayer reflective film according to the configuration 7 characterized in that the protective film includes a material containing ruthenium (Ru). The protective film which includes a material containing ruthenium (Ru) is more effective in maintaining the reflectance of the multilayer reflective film at a high value.

Another aspect of the invention resides in reflective mask blank production methods characterized by the following configurations 9 to 14.

(Configuration 9)

The configuration 9 of the present invention resides in a method for producing a reflective mask blank comprising an absorber film formation step of forming an absorber film on the multilayer reflective film of a substrate with a multilayer reflective film obtained by the method for producing a substrate with a multilayer reflective film described in any one of the configurations 1 to 8. Reflective masks for EUV lithography having a pattern of the absorber film can be obtained with reflective mask blanks for EUV lithography having an absorber film. The inventive reflective mask blanks for EUV lithography may further include a thin film for the patterning of the absorber film, for example, a resist film, on the absorber film.

(Configuration 10)

The configuration 10 of the present invention resides in the reflective mask blank production method according to the configuration 9 characterized in that the absorber film is formed in the absorber film formation step such that the absorber film does not cover the slope region. When the fiducial marks have been formed in the slope region, the absence of the absorber film in the slope region allows the fiducial marks to attain the same high contrast as they show in relation to the substrate with a multilayer reflective film when the fiducial marks are detected with defect inspection light and electron beam.

(Configuration 11)

The configuration 11 of the present invention resides in a method for producing a reflective mask blank, the reflective mask blank including a multilayer reflective film disposed on a principal surface of a substrate and an absorber film disposed on the multilayer reflective film, the multilayer reflective film including higher refractive index layers and lower refractive index layers alternately stacked on top of one another, the method including a multilayer reflective film formation step of forming the multilayer reflective film on the principal surface of the substrate in such a manner that the multilayer reflective film has a slope region in which the film thickness is decreased in a direction from the inside to the outside of the substrate on a peripheral portion of the principal surface, an absorber film formation step of forming the absorber film on the multilayer reflective film of the substrate with a multilayer reflective film, and a fiducial mark formation step of forming fiducial marks in the slope region by removing at least a portion of the multilayer reflective film, the fiducial marks serving as references for a defective location indicated by defect information with respect to the surface of the substrate with a multilayer reflective film. In the reflective mask blank according to the invention, the fiducial marks are formed in the slope region of the multilayer reflective film in which the film thickness is small. Consequently, the time required for the formation of the fiducial marks can be reduced. Further, the fiducial marks thus formed advantageously attain a vertical cross section and also achieve good alignment accuracy.

(Configuration 12)

The configuration 12 of the present invention resides in the reflective mask blank production method according to the configuration 11 characterized in that the fiducial marks are formed in the fiducial mark formation step by removing at least a portion of the multilayer reflective film by etching or with focused ion beam. The use of etching or focused ion beam makes it possible to reliably remove the multilayer reflective film and, optionally, the absorber film disposed thereon for forming a desired shape of the fiducial marks.

(Configuration 13)

The configuration 13 of the present invention resides in a method for producing a reflective mask blank, the reflective mask blank including a substrate, a multilayer reflective film disposed on a principal surface of a substrate and an absorber film disposed on the multilayer reflective film, the multilayer reflective film including higher refractive index layers and lower refractive index layers alternately stacked on top of one another, the method including a preparation step of substrate with a multilayer reflective film with forming the multilayer reflective film on the principal surface of the substrate to prepare a substrate with a multilayer reflective film, an absorber film formation step of forming the absorber film on the multilayer reflective film in such a manner that the absorber film has a slope region in which the film thickness is decreased in a direction from the inside to the outside of the substrate on a peripheral portion of the principal surface, and a fiducial mark formation step of forming fiducial marks in the slope region by removing at least a portion of the absorber film, the fiducial marks serving as references for a defective location indicated by defect information with respect to the surface of the reflective mask blank or defect information with respect to the surface of the substrate with a multilayer reflective film. In the reflective mask blank according to the invention, the fiducial marks are formed in the slope region of the absorber film in which the film thickness is small. Consequently, the time required for the formation of the fiducial marks can be reduced. Further, the fiducial marks thus formed advantageously attain a vertical cross section and also achieve good alignment accuracy.

(Configuration 14)

The configuration 14 of the present invention resides in the reflective mask blank production method according to the configuration 13 characterized in that the fiducial marks are formed in the fiducial mark formation step by removing at least a portion of the absorber film by etching or with focused ion beam. The use of etching or focused ion beam makes it possible to reliably remove the absorber film and, optionally, the protective film and the multilayer reflective film disposed under the absorber film for forming a desired shape of the fiducial marks.

(Configuration 15)

The configuration 15 of the present invention resides in a method for producing a reflective mask including a pattern forming step of patterning the absorber film of a reflective mask blank produced by the production method described in any one of the configurations 9 to 14. In the reflective mask according to the present invention, defects in the reflective mask blank can be hidden under the pattern of the absorber film. Thus, the reflective mask may be used in the projection of exposure light onto a semiconductor substrate while preventing adverse effects ascribed to the defects.

The methods for producing a substrate with a multilayer reflective film and reflective mask blanks according to the present invention can produce fiducial marks in the substrate with the multilayer reflective film and the reflective mask blanks in a short time while ensuring that the fiducial marks will attain sufficient contrast when the fiducial marks are detected with defect inspection light and electron beam.

DETAILED DESCRIPTION OF THE INVENTION

Figure 1:
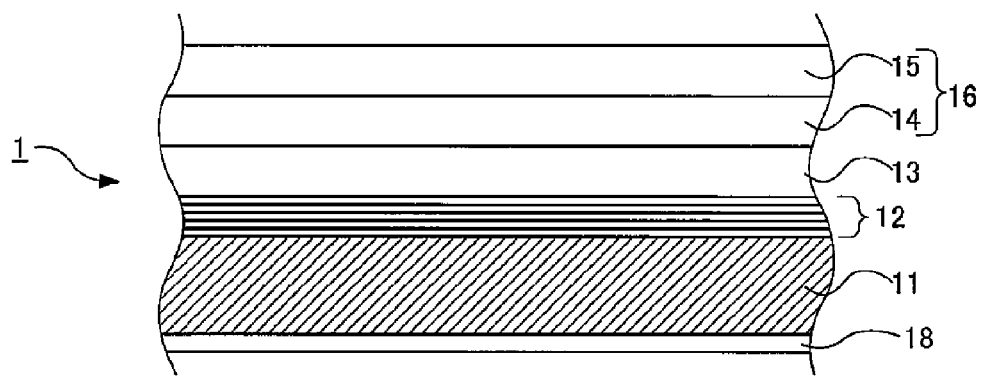
FIG. 1 is a schematic sectional view illustrating an exemplary configuration of a reflective mask blank.

An aspect of the invention resides in a method for producing a substrate with a multilayer reflective film for EUV lithography including a multilayer reflective film 12 disposed on a principal surface 71 of a substrate, the multilayer reflective film including higher refractive index layers and lower refractive index layers alternately stacked on top of one another. The production method of the invention is characterized in that a slope region 90 is provided in the multilayer reflective film 12 of the substrate with a multilayer reflective film and that fiducial marks 80 are formed in the slope region 90, the fiducial marks serving as references for a defective location indicated by defect information with respect to the surface of the substrate with a multilayer reflective film.

For example, the defect information with respect to the surface of the substrate with a multilayer reflective film may be obtained by an inspection method in which a 266 nm wavelength UV laser or a 193 nm wavelength ArF excimer laser is used as an inspection light source and the laser light is applied to the surface of the multilayer reflective film to detect foreign substances based on the reflected light, or an at-wavelength defect inspection method in which defects are detected with use of EUV light having the same wavelength as the light used in mask pattern exposure. In the defect inspection, the fiducial marks 80 formed in the surface of the substrate with a multilayer reflective film allow for accurate grasping and storage of the information of the positions of defects in the substrate with a multilayer reflective film.

By the implementation of the above defect inspection, the stored defective location information can assist in the formation of an absorber film pattern 22 to determine the relative positions of an absorber pattern mask for defining the absorber film pattern 22 and a reflective mask blank 1 using the substrate with a multilayer reflective film. In this process, the absorber pattern mask may be positioned such that the absorber film pattern 22 will cover and hide the defects on the reflective mask blank 1. The absorber film pattern 22 may be formed on the mask blank 1 based on the relative positions that have been determined. The formation of the absorber film pattern 22 in this manner results in a reflective mask 2 in which the defects are hidden under the absorber film pattern 22. Thus, the reflective mask 2 may be used in the projection of exposure light onto a semiconductor substrate while preventing adverse effects ascribed to the defects.

Figure 2:
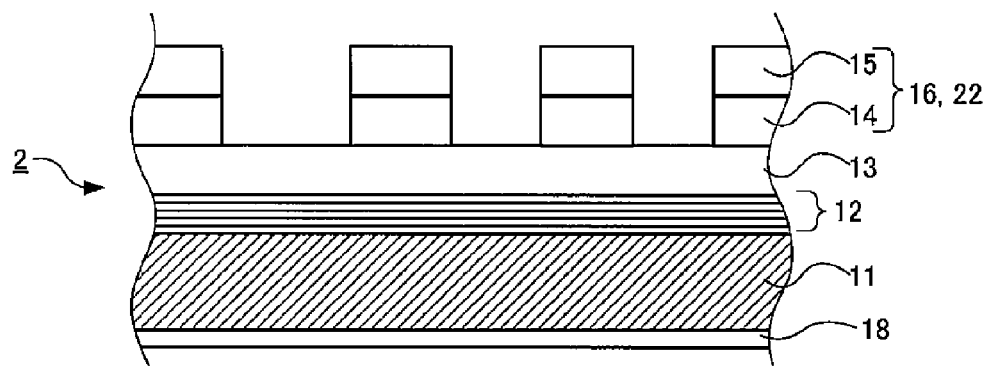
FIG. 2 is a schematic sectional view illustrating an exemplary configuration of a reflective mask.
Figure 3:
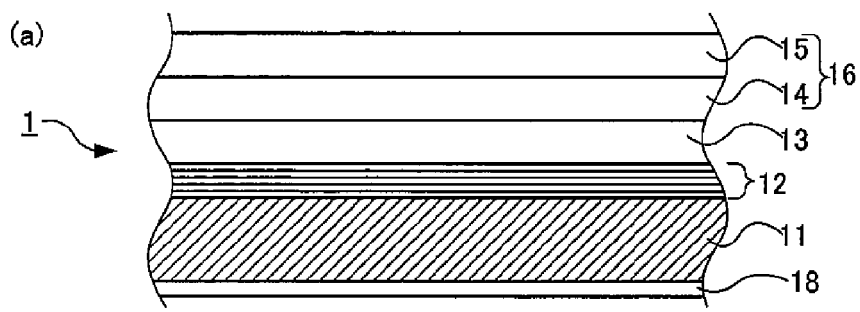
FIG. 3 is a set of schematic sectional views illustrating an example of a process in which a reflective mask blank is processed into a reflective mask.
Figure 3:
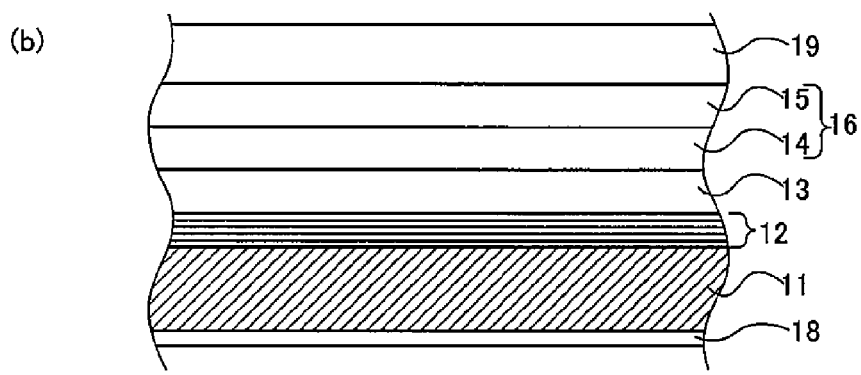
Figure 3:
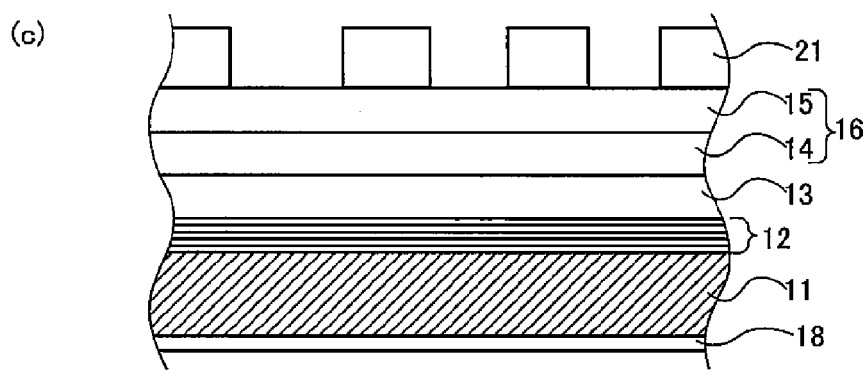
Figure 3:
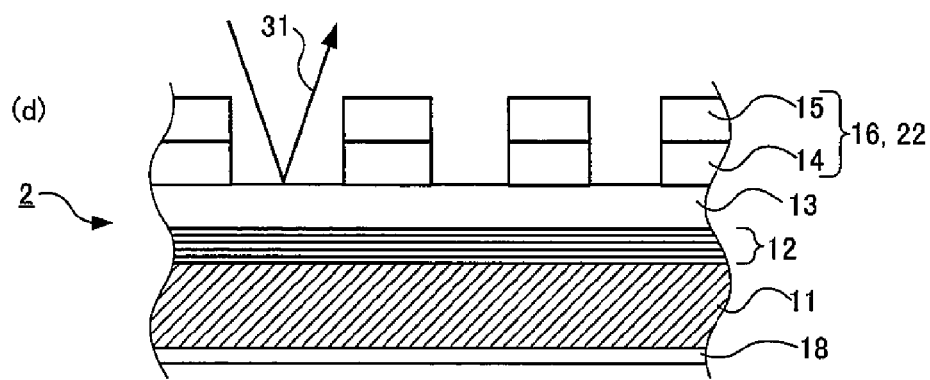

FIG. 1 is a schematic sectional view illustrating an exemplary configuration of a reflective mask blank 1 of the invention. FIG. 2 is a schematic sectional view illustrating an exemplary configuration of a reflective mask 2 obtained according to the invention. FIG. 3 is a set of schematic sectional views illustrating an example of general steps in a method for producing a reflective mask 2 of the invention. In a substrate with a multilayer reflective film and a reflective mask blank 1 according to the present invention, a multilayer reflective film 12 capable of reflecting EUV light 31 is formed on a glass substrate 11. The substrate with a multilayer reflective film for EUV lithography of the invention refers to a stack which has a multilayer reflective film 12 for reflecting EUV light 31 on a glass substrate 11. The substrate with a multilayer reflective film for EUV lithography of the invention may include a multilayer reflective film 12 for reflecting EUV light 31 on a glass substrate 11 and a protective film 13 (a capping layer) disposed on the multilayer reflective film 12. The protective film 13 protects the multilayer reflective film 12 during the formation of an absorber film pattern 22. The substrate with a multilayer reflective film for EUV lithography of the invention may include a resist film 19 on the multilayer reflective film 12 or on the protective film 13, when fiducial marks 80 are formed in the multilayer reflective film 12 and/or the protective film 13 by a lithography process including an etching process.

An example of a reflective mask blank 1 used in an inventive method for the production of a reflective mask 2 is configured as illustrated in FIG. 1. Specifically, the example shown in FIG. 1 has, sequentially disposed a glass substrate 11, a multilayer reflective film 12 that reflects exposure light with a wavelength in a short wavelength region including an EUV region, a protective film 13 that protects the multilayer reflective film 12 during the formation of an absorber film pattern 22 and during the correction of the absorber film pattern 22, and an absorber film 16 that absorbs the exposure light with a wavelength in a short wavelength region including an EUV region. In the reflective mask blank 1 shown as an example in FIG. 1, the absorber film 16 has a two-layer structure in which the lower layer is an exposure light absorbing layer 14 that absorbs the exposure light with a wavelength in a short wavelength region including an EUV region, and the upper layer is a low reflectance layer 15 that has a low reflectance to inspection light used for the inspection of the absorber film pattern 22.

As illustrated in FIG. 2, a reflective mask 2 obtained according to the invention has a pattern in the absorber film 16 (namely, the low reflectance layer 15 and the exposure light absorbing layer 14) of the reflective mask blank 1 described above. In the reflective mask 2 having the above absorber film 16 that is a stack, the functions of the absorber film 16 are separated such that the layer for absorbing the exposure light and the layer with a low reflectance to the mask pattern inspection wavelength, which form the stack. With this configuration, sufficient contrast may be obtained during the inspection of the mask pattern.

To realize the transfer of a minute pattern finer than the transfer limit according to a conventional photolithography method, the reflective mask 2 obtained in the invention is used in lithography using light with a wavelength in a short wavelength region including an EUV light region, it can be used as a reflective mask 2 for EUV exposure light.

The substrate 11 used in the substrate with a multilayer reflective film for EUV lithography of the invention may be preferably a glass substrate 11 because such a substrate has good smoothness and flatness. Specific examples of the materials for the substrates 11 include synthetic quartz glasses, and low thermal expansion $SiO_2$—$TiO_2$ glasses (for example, binary system ($SiO_2$—$TiO_2$) and ternary system ($SiO_2$—$TiO_2$—$SiO_2$)) such as $SiO_2$—$Al_2$—$O_3$—$Li_2O$ crystalline glass and β quartz solid solution-precipitated crystalline glass.

To obtain high reflectance and high transfer accuracy, the glass substrate 11 preferably has a smooth surface with a surface roughness of not more than 0.2 nm Rms and a degree of flatness of not more than 100 nm. In the invention, the parameter Rms that is an indicator of smoothness is a root mean squared roughness and may be measured with an atomic force microscope. Further, the degree of flatness in the invention is a value that indicates the warpage (the amount of deformation) of the surface expressed by TIR (total indicated reading). Specifically, a plane that serves as a focal plane is determined by a least square method with reference to the surface of the glass substrate 11, and the difference in height between the farthest locations of the surface of the glass substrate 11 above and below the focal plane is obtained in an absolute value. The smoothness is measured with respect to a 10 μm square, and the degree of flatness is measured over a 142 mm square.

Figure 5:
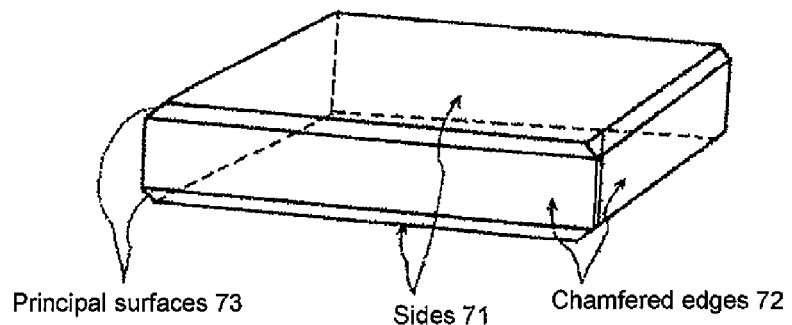
FIG. 5 is a schematic view illustrating a glass substrate which may be used in the invention.

The "principal surface 71" of the glass substrate 11 is, as illustrated in FIG. 5, either of the surfaces of the glass substrate 11 except the peripheral portions (sides 72 and chamfered edges 73). That is, the "principal surfaces 71" of the glass substrate 11 are the surfaces illustrated as the two opposed "principal surfaces 71" in FIG. 5.

An aspect of the invention resides in a method for producing a substrate with a multilayer reflective film for EUV lithography which has, on the principal surface 71 of the substrate 11, a multilayer reflective film 12 including higher refractive index layers and lower refractive index layers alternately stacked on top of one another.

The multilayer reflective film 12 disposed on the principal surface 71 of the glass substrate 11 is composed of materials that reflect exposure light with a wavelength in a short wavelength region including an EUV region. Particularly preferably, the multilayer reflective film 12 is composed of materials that have extremely high reflectance to short wavelength light such as EUV light because the contrast in the use of the reflective mask 2 may be increased. An alternate stack of higher refractive index layers and lower refractive index layers may be suitably used as the multilayer reflective film 12 because such a multilayer reflective film 12 has extremely high reflectance to short wavelength light such as EUV light and can attain high contrast in the use of the reflective mask 2.

The lower refractive index layers that constitute the multilayer reflective film 12 preferably include at least one material selected from the group consisting of Mo, Nb, Ru and Rh. Further, the higher refractive index layers that constitute the multilayer reflective film 12 preferably include at least one material selected from the group consisting of Si and Si compounds. In the method for producing a substrate with a multilayer reflective film of the invention, it is preferable that the lower refractive index layers are molybdenum (Mo) and the higher refractive index layers are silicon (Si). A periodic stack in which thin films of silicon (Si) and molybdenum (Mo) are stacked alternately on top of one another may be suitably used as a multilayer reflective film 12 for reflecting EUV light in the soft X-ray region with a wavelength of about 12 to 14 nm. The multilayer reflective film 12 usually has 40 to 60 cycles (pairs) of thin (approximately several nm) films of higher refractive index layers and lower refractive index layers.

Examples of the multilayer reflective films which may be used in the EUV light region further include periodic Ru/Si multilayer reflective films, periodic Mo/Be multilayer reflective films, periodic Mo compound/Si compound multilayer reflective films, periodic Si/Nb multilayer reflective films, periodic Si/Mo/Ru multilayer reflective films, periodic Si/Mo/Ru/Mo multilayer reflective films, and periodic Si/Ru/Mo/Ru multilayer reflective films.

The multilayer reflective film 12 may be formed by a method such as an ion beam sputtering method or a magnetron sputtering method. In particular, the method for producing a substrate with a multilayer reflective film of the invention preferably utilizes an ion beam sputtering method for the formation of the multilayer reflective film 12. By an ion beam sputtering method, the cycles of the higher refractive index layers and the lower refractive index layers may be formed with desired thicknesses and with good reproducibility.

In the method for producing a substrate with a multilayer reflective film of the invention, these layers are preferably formed in such a manner that sputtered particles 66 for the lower refractive index layers have a larger incident angle relative to the normal to the principal surface 71 of the substrate 11 compared to an incident angle of sputtered particles 66 for the higher refractive index layers. In more detail, it is preferable that sputtered particles for Mo layers (Mo particles) have an incident angle 66 that is larger than the incident angle of sputtered particles for Si layers (Si particles).

Figure 12:
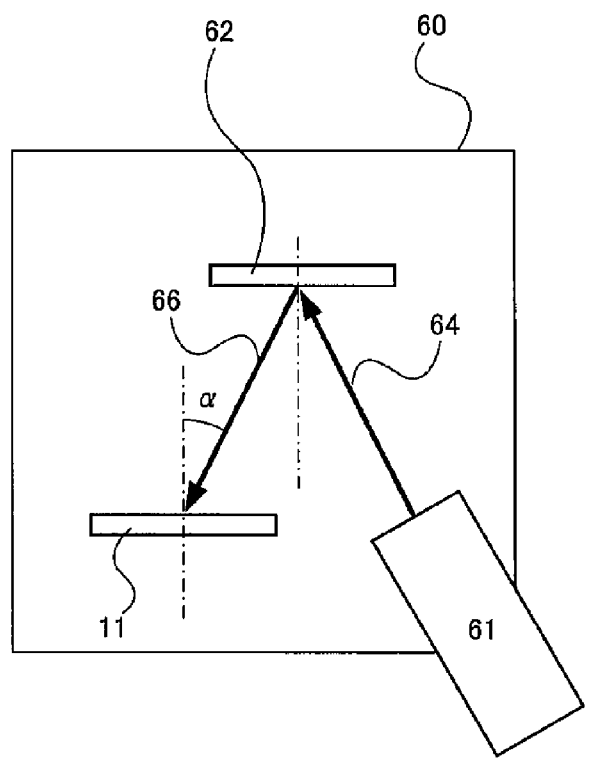
FIG. 12 is a schematic view illustrating a film deposition apparatus based on an ion beam sputtering method.

FIG. 12 is a schematic view illustrating a film deposition apparatus based on an ion beam sputtering method. In FIG. 12, it shows an incident angle α of the sputtered particles 66 relative to the normal to the principal surface 71 of the substrate 11 in an ion beam sputtering method. In the case of an ion beam sputtering method, the incident angle α is an angle relative to the normal to the principal surface 71 of the substrate 11 at which the sputtered particles 66 generated by an ion beam 64 applied to a target 62 are incident on the substrate 11. When the sputtered particles 66 for the lower refractive index layers have an incident angle $α_1$ that is larger than the incident angle $α_2$ of the sputtered particles 66 for the higher refractive index layers, the kinetic energy of the lower refractive index material particles being sputtered is dispersed into a component perpendicular to the surface of the substrate 11 and a component parallel to the substrate 11. Accordingly, the lower refractive index material particles being sputtered can land on the higher refractive index layer with small collision energy. As a result, the lower refractive index materials may be prevented from being diffused into the higher refractive index layers, and the formation of metal diffusion layers may be suppressed. Thus, high reflectance may be obtained by the multilayer reflective film 12 alone, namely, the constituent materials for the multilayer reflective film 12 alone without any anti-diffusion layers. Further, the multilayer reflective film 12 fabricated in the above manner can increase the process rate of the formation of fiducial marks 80 with focused ion beam 64 or by etching. The reason for this is because the slope region in the multilayer reflective film contains a larger proportion of the lower refractive index materials, namely, metals, alloys or compounds thereof that exhibit a high etching rate in the etching with the focused ion beam or the etchant in a fluorine-containing gas.

It is preferable that the sputtered particles 66 for the lower refractive index layers such as Mo layers have an incident angle $\alpha_1$ of not less than 40 degrees and less than 90 degrees and the sputtered particles 66 for the higher refractive index layers such as Si layers have an incident angle $\alpha_2$ of not less than 5 degrees and not more than 60 degrees. When the multilayer reflective film 12 is formed while utilizing these incident angles, a further improvement may be achieved in the process rate with focused ion beam 64 or by etching during the formation of fiducial marks 80.

The method for producing a reflective mask 2 according to the invention includes a multilayer reflective film formation step in which the multilayer reflective film 12 is formed on the principal surface 71 of the substrate 11 in such a manner that the multilayer reflective film has a slope region 90 in which the film thickness is decreased in a direction from the inside to the outside of the substrate 11 on a peripheral portion of the principal surface 71.

Figure 7:
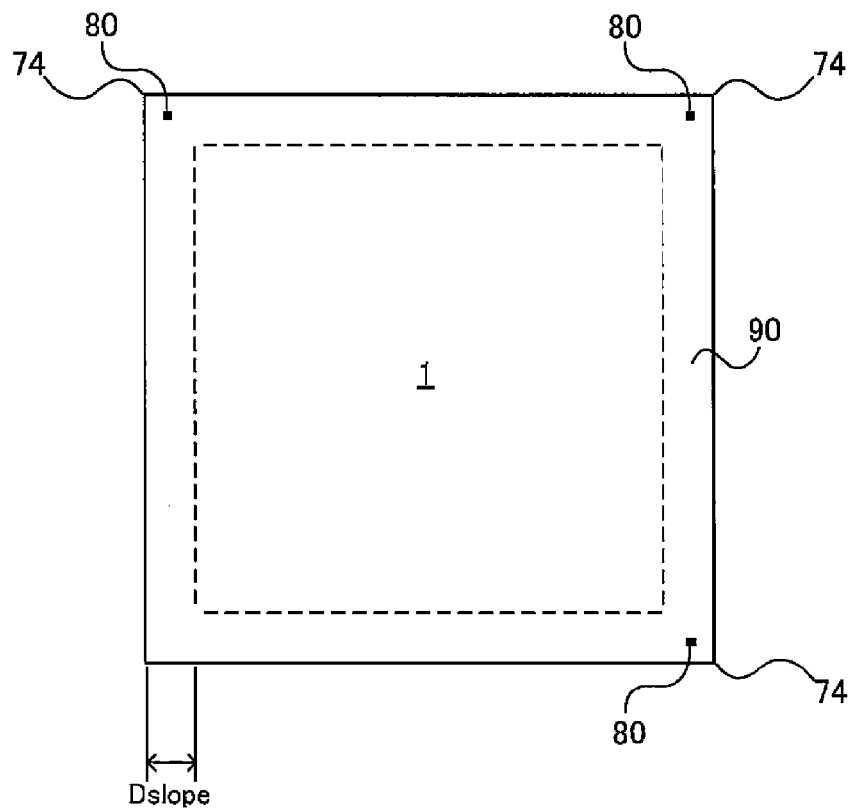
FIG. 7 is a schematic view illustrating an inventive reflective mask blank having three fiducial marks.
Figure 10:
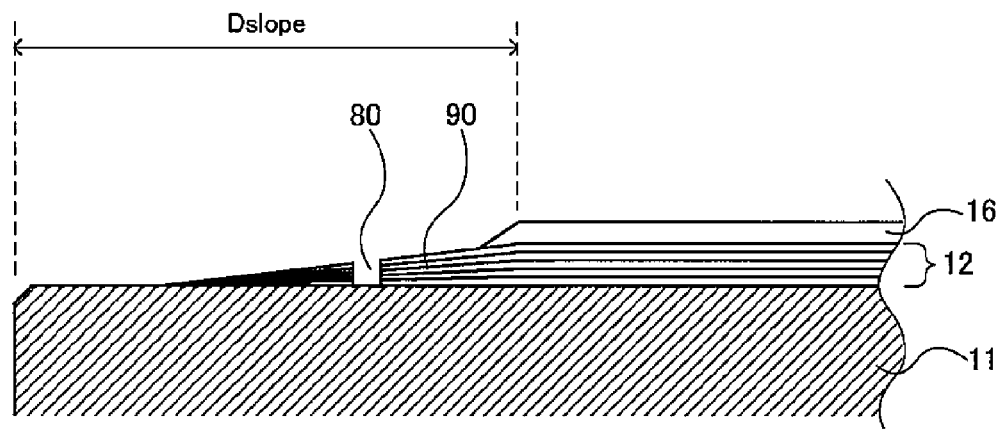
FIG. 10 is a schematic sectional view illustrating a peripheral portion of an inventive reflective mask blank.

FIG. 7 shows an example of inventive reflective mask blanks 1 having three fiducial marks 80. The number of fiducial marks 80 is not particularly limited. At least three fiducial marks 80 (at least three locations) are required, but there may be more than three fiducial marks. As illustrated in FIG. 7, a slope region 90 is provided on a peripheral portion of the principal surface 71 of the substrate 11. FIG. 10 is a schematic sectional view illustrating a peripheral portion of an inventive reflective mask blank 1. As illustrated in FIG. 10, the multilayer reflective film 12 in the slope region 90 reduces the film thickness in a direction from the inside to the outside of the substrate 11. The fiducial marks 80 are formed in the slope region 90 of the multilayer reflective film 12 in which the film thickness is small. Consequently, the time required for the formation of the fiducial marks 80 can be reduced. The substrate with a multilayer reflective film may have a slope region 90 similarly to the reflective mask blank 1.

Provided that the size of the substrate 11 is 152 mm×152 mm, the slope region 90 is preferably disposed in a region having a width of 5 mm from the sides 72 of the substrate 11, namely, in a region outside the 142 mm×142 mm region, thereby ensuring that the slope region does not affect an absorber film pattern 22 of a reflective mask 2. In this case, the width of the slope region illustrated in FIG. 7, Dslope, is 5 mm. Provided that the size of the substrate 11 is 152 mm×152 mm similarly to the above, the slope region 90 may be more preferably disposed between the 142 mm×142 mm size and the 150 mm×150 mm size excluding the region having a width of 1 mm from the sides 72 of the substrate 11, and still more preferably disposed between the 142 mm×142 mm size and the 148 mm×148 mm size.

Figure 8:
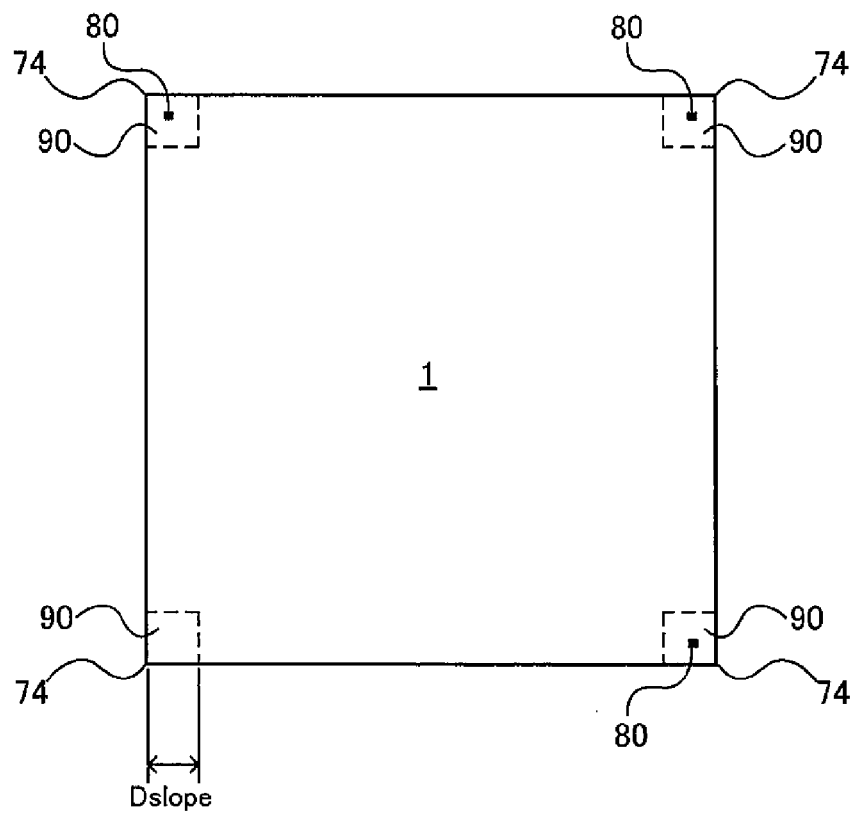
FIG. 8 is a schematic view illustrating an inventive reflective mask blank having three fiducial marks.

As illustrated in FIG. 8, the slope regions 90 may be formed only in tetragonal regions at corners 74 of the substrate 11. The fiducial marks 80 may be disposed in the tetragonal regions at the corners 74. Provided that the size of the substrate 11 is 152 mm×152 mm, the slope regions 90 may be such that the size of the tetragonal regions at the corners 74 of the substrate 11 is 9 mm×9 mm. In the case shown in FIG. 8, the width of the slope region, Dslope, is equal to the length of a side of the tetragonal shape at the corner 74 (for example, 9 mm).

Figure 9:
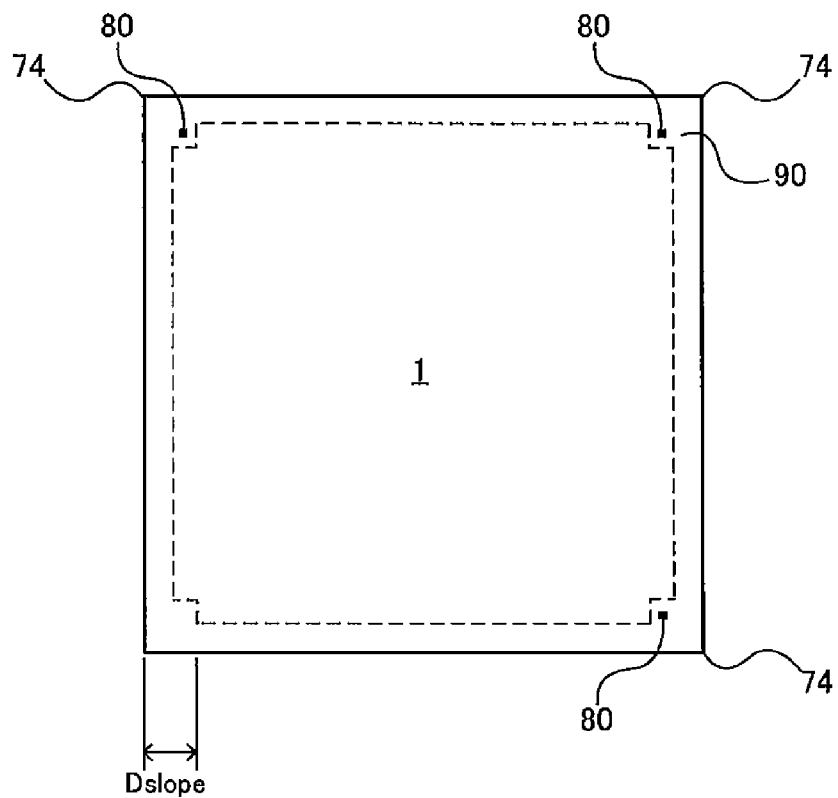
FIG. 9 is a schematic view illustrating an inventive reflective mask blank having three fiducial marks.

Further, as illustrated in FIG. 9, the slope region 90 may be formed such that tetragonal regions at the corners 74 of the substrate 11 are larger than the other regions. In this case too, the fiducial marks 80 may be disposed in the tetragonal regions at the corners 74. Provided that the size of the substrate 11 is 152 mm×152 mm, the slope region 90 may be disposed in regions having a width of 5 mm from the sides 72 of the substrate 11, namely, in regions outside the 142 mm×142 mm region, and also in 9 mm×9 mm regions at the corners 74 of the substrate 11. In the case shown in FIG. 9, the width of the slope region, Dslope, is equal to the length of a side of the tetragonal shape at the corner 74 (for example, 9 mm).

In the method for producing a substrate with a multilayer reflective film of the invention, it is preferable that, in the multilayer reflective film formation step, the higher refractive index layers and the lower refractive index layers are formed by a sputtering method such that a shielding member 68 disposed apart from the peripheral portion, and the higher refractive index layers and the lower refractive index layers are deposited at an angle relative to the normal to the principal surface 71 of the substrate 11.

Figure 11:
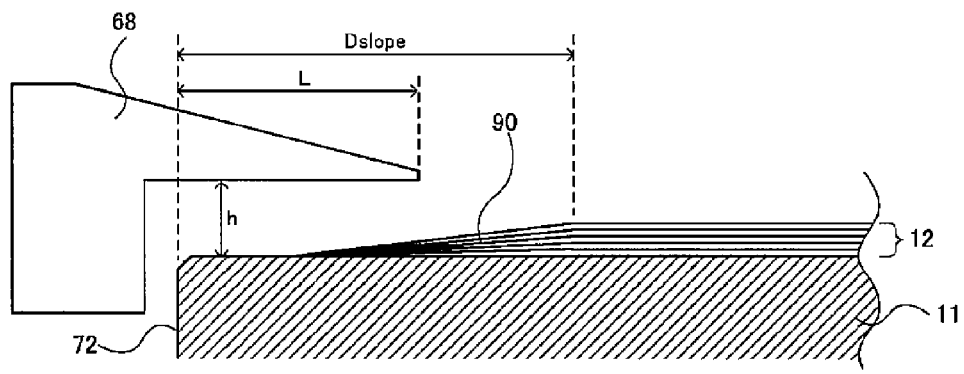
FIG. 11 is a view illustrating the formation of a multilayer reflective film with a slope region by a sputtering method involving a shielding member.

FIG. 11 illustrates an example of the formation of the multilayer reflective film by a sputtering method with a shielding member 68 disposed apart from the peripheral portion. The shielding member 68 prevents the sputtered particles 66 from being deposited on the peripheral portion of the substrate 11. Accordingly, the sputtered particles 66 are deposited while being incident at an angle relative to the normal to the principal surface 71 of the substrate 11. As a result, the materials for the multilayer reflective film 12 (the higher refractive index layers and the lower refractive index layers) are deposited so as to have a thickness distribution in which the film thickness is decreased in a direction from the inside to the outside of the substrate 11 on the peripheral portion of the principal surface 71. In this manner, the slope region 90 may be easily and reliably formed in the multilayer reflective film 12 by providing the shielding member 68 apart from the peripheral portion. With the shielding member 68, the slope region 90 may be formed without changing the usual process for forming the multilayer reflective film 12.

In a sputtering method with the shielding member 68 as illustrated in FIG. 11, the thickness and the tilt angle of the multilayer reflective film 12 in the slope region 90 may be controlled by adjusting the height h between the principal surface 71 of the substrate 11 and the shielding member 68, the shielding length L of the shielding member 68, and the incident angles $\alpha$ of the sputtered particles, namely, the materials for the multilayer reflective film 12 (the materials for the higher refractive index layers and the lower refractive index layers) relative to the normal to the principal surface 71 of the substrate 11. The substrate 11 may be mounted on a rotating stage 63 and the substrate 11 may be rotated during film deposition. This configuration allows the slope region 90 formed at a prescribed incident angle $\alpha$ in all the sides of the tetragonal substrate 11 by the rotation of the substrate 11.

To make sure that the slope region 90 has a prescribed film thickness, a sputtering method with the shielding member 68 as illustrated in FIG. 11 is designed such that the sputtered particles, namely, the materials for the multilayer reflective film 12 (the materials for the higher refractive index layers and the lower refractive index layers) have an incident angle cc relative to the normal to the principal surface 71 of the substrate 11 and the incident angle $\alpha$ is preferably not less than 5 degrees and less than 90 degrees, and more preferably not less than 10 degrees and not more than 80 degrees, not less than 15 degrees and not more than 70 degrees, and not less than 20 degrees and not more than 60 degrees. The height h between the principal surface 71 of the substrate 11 and the shielding member 68 is preferably 0.1 mm to 1.0 mm, and more preferably 0.2 mm to 0.6 mm. The shielding length L of the shielding member 68 is preferably 0.5 mm to 4.0 mm, and more preferably 1.0 mm to 2.0 mm.

The method for producing a substrate with a multilayer reflective film of the invention includes a fiducial mark formation step in which the fiducial marks 80 are formed in the slope region 90 by removing at least a portion of the multilayer reflective film 12, the fiducial marks serving as references for a defective location indicated by defect information with respect to the surface of the substrate with a multilayer reflective film.

Because the thickness of the multilayer reflective film 12 in the slope region 90 is small as described above, the slope region 90 may be given the fiducial marks 80 in a short time. Because the fiducial marks 80 are formed in the slope region 90 in which the film thickness is small, the fiducial marks formed advantageously attain a vertical cross section and also achieve good alignment accuracy. The fiducial marks 80 may be formed by any of such methods as a lithography process including an etching process, focused ion beam irradiation, laser light irradiation, scanning with a probe such as a diamond stylus so as to produce processing marks, indentation with a micro indenter, and stamping by an imprint method. Among these methods, a lithography process including an etching process, or focused ion beam irradiation achieves a marked reduction in the processing time required for the formation of the fiducial marks 80. To enhance the contrast of the fiducial marks 80, the fiducial marks 80 are preferably formed by removing all the layers of the multilayer reflective film 12 to a prescribed shape with focused ion beam 64 or by a lithography process including an etching process. When, however, sufficient contrast can be obtained without processing all the layers of the multilayer reflective film 12, the process does not necessarily require removing all the layers of the multilayer reflective film 12. In the method for producing a substrate with a multilayer reflective film of the invention, the fiducial marks 80 are formed in the slope region 90 and additional fiducial marks 80 may be formed in a region inside the slope region 90.

Figure 6:
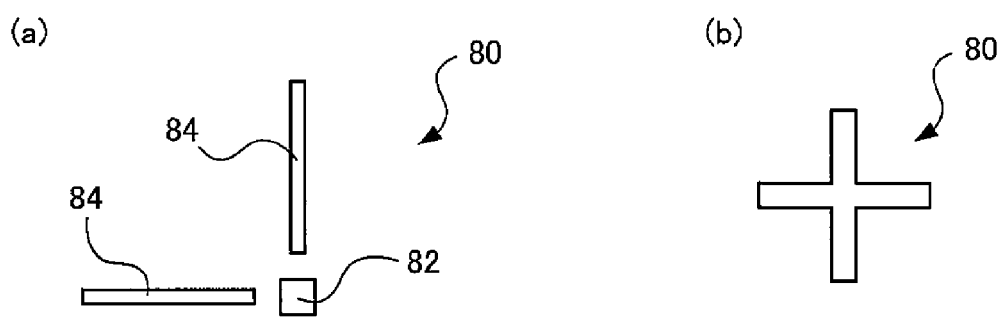
FIG. 6 is a set of schematic views illustrating examples of fiducial marks which may be used in the invention.

For example, the shapes of the fiducial marks 80 may be those illustrated in FIGS. 6(a) and (b). For example, the fiducial mark 80 shown in FIG. 6(a) is composed of a fine mark 82 and two auxiliary marks 84. The fine mark 82 may be a 5 µm×5 µm square, and the two auxiliary marks 84 may be 1 µm×200 µm rectangles. In general, the fine mark 82 is for the determination of a position (a reference point) that serves as a reference for a defective location, and the auxiliary marks 84 assist in roughly identifying the position of the fine mark 82 with defect inspection light or electron beam. The fine mark 82 preferably has a point symmetric shape that has a portion with a width of 0.2 µm to 10 µm in the direction of scanning with defect inspection light or electron beam. The shapes of the fine marks 82 are not limited to squares such as that shown in FIG. 6(a), and may be other shapes such as round-cornered squares, octagonal shapes and cross-like shapes. The auxiliary marks 84 are preferably disposed around the fine mark 82 along the direction of scanning with defect inspection light or electron beam. The shapes of the auxiliary marks 84 are preferably rectangles that have longer sides and shorter sides extending perpendicularly and in parallel to the direction of scanning with defect inspection light or electron beam, respectively. When the auxiliary marks 84 are rectangles that have longer sides and shorter sides extending perpendicularly and in parallel to the direction of scanning with defect inspection light or electron beam, respectively, the auxiliary marks 84 may be reliably detected by the scanning with a defect inspection apparatus or an electron beam drawing apparatus, and consequently the position of the fine mark 82 may be easily identified.

The reference point that serves as a reference for a defective location may be determined with the fiducial mark of FIG. 6(a) in the following manner. Scanning is performed over the auxiliary marks 84 with defect inspection light or electron beam in the X direction and in the Y direction, thereby detecting the auxiliary marks 84. This detection allows the position of the fine mark 82 to be roughly identified. Scanning is then performed over the identified fine mark 82 with defect inspection light or electron beam in the X direction and in the Y direction, and the intersection P on the fine mark 82 (usually the rough center of the fine mark 82) that has been detected by the scanning of the auxiliary marks is determined as the reference point.

The fiducial marks 80 are preferably formed such that the positions of fiducial marks 80 (central positions) are arranged in portions of the slope region 90 in which the film thickness is ⅓ to ½ of the film thickness at the center of the multilayer reflective film 12. For example, provided that the width Dslope of the slope region is 5 mm, the fiducial marks 80 are preferably formed such that the positions (central positions) are 1.5 mm to 4.0 mm away from the sides 72 of the substrate 11.

In the method for producing a substrate with a multilayer reflective film of the invention, it is preferable that the fiducial marks 80 is formed in the fiducial mark formation step by removing at least a portion of the multilayer reflective film 12 by etching or with focused ion beam 64. The use of etching or focused ion beam 64 makes it possible to reliably remove the multilayer reflective film 12 for forming a desired shape of the fiducial marks 80.

By utilizing the fiducial marks 80 formed as described above in defect inspection, the information of defective locations in the substrate with the multilayer reflective film may be accurately grasped and stored.

The method for producing a substrate with a multilayer reflective film of the invention preferably includes a protective film 13 formation step in which a protective film 13 is formed on the multilayer reflective film 12.

In the example of reflective mask blanks 1 illustrated in FIG. 1, a protective film 13 is disposed between the multilayer reflective film 12 and the absorber film 16. The protective film 13 prevents damages to the multilayer reflective film 12 not only during the formation of a pattern of the absorber film 16 but also during pattern correction. As a result, the reflectance of the multilayer reflective film 12 may be advantageously maintained at a high value.

The protective film 13 may be formed on the multilayer reflective film 12 before the formation of the fiducial marks 80 or after the formation of the fiducial marks 80. In order to prevent a decrease in the reflectance of the multilayer reflective film 12 due to washing after the formation of the fiducial marks 80, the protective film 13 is preferably formed before the formation of the fiducial marks 80, namely, the formation of the fiducial marks 80 preferably takes place on a substrate with a multilayer reflective film in which the protective film 13 has been formed on the multilayer reflective film 12.

The protective film 13 may be formed by a film deposition method such as an ion beam sputtering method or a magnetron sputtering method. Similarly to the formation of the multilayer reflective film 12, the protective film 13 is preferably formed in such a manner that the material for the protective film 13 is deposited at an angle relative to the normal to the principal surface 71 of the substrate 11. Specifically, it is preferable that the protective film 13 has a thickness distribution similar to that of the multilayer reflective film. The formation of the protective film 13 may be with the aforementioned shielding member 68, or may be performed without the shielding member 68. Preferably, the protective layer 13 is formed with use of the shielding member 68 because the thickness of the protective film 13 may be advantageously reduced.

In the method for producing a substrate with a multilayer reflective film of the invention, it is preferable that the protective film 13 include a material containing ruthenium (Ru).

Examples of the materials for the protective films 13 include Ru, alloys of Ru with Nb, Zr, Y, B, Ti, La or Mo, alloys of Si with Ru, Rh, Cr or B, and materials such as Si, Zr, Nb, La, B and Ta. Among these materials, ruthenium (Ru)-containing materials, in detail, Ru, or alloys of Ru with Nb, Zr, Y, B, Ti, La and/or Mo are preferable as the materials for the protective films 13 from the viewpoint of reflectance properties.

In the substrate with a multilayer reflective film according to the invention, a conductive film 18 may be disposed on a principal surface 71 of the glass substrate 11 opposite to the principal surface 71 on which the multilayer reflective film 12 is disposed. (Hereinafter, this principal surface will be written as the "back surface".) When the substrate with a multilayer reflective film has the conductive film 18 on the back surface, an electrostatic chuck shows higher performance during the reflective mask 2 is set on a pattern transfer apparatus 50. The materials for the conductive films 18 are not limited as long as the electrostatic chuck can be operated appropriately. Examples of the materials include metals and alloys such as chromium (Cr) and tantalum (Ta), and oxides, nitrides, carbides, oxynitrides, oxycarbides and oxycarbonitrides of the metals and the alloys described above. In particular, TaBN and/or TaN may be preferably used, and TaBN/$Ta_2O_5$ or TaN/$Ta_2O_5$ may be more preferably used. The conductive film 18 may be a single layer, a stack or a composition gradient layer.

To ensure appropriate operation of the electrostatic chuck, the sheet resistance of the conductive film 18 may be preferably not more than 200Ω/□, more preferably not more than 100Ω/□, still more preferably not more than 75Ω/□, and particularly preferably not more than 50Ω/□. The sheet resistance of the conductive film 18 may be controlled appropriately by adjusting the composition and the thickness of the conductive film 18.

Next, there will be described a method for producing a reflective mask blank 1 according to the present invention.

An aspect of the invention resides in a method for producing a reflective mask blank 1 including an absorber film formation step of forming an absorber film 16 on a multilayer reflective film 12 of a substrate with a multilayer reflective film obtained by the method for producing a substrate with a multilayer reflective film described above.

FIG. 1 shows a schematic sectional view illustrating an example of a reflective mask blank 1 for EUV lithography according to the present invention. As illustrated in FIG. 1, a reflective mask blank 1 for EUV lithography includes a prescribed absorber film 16 on a multilayer reflective film 12 of a substrate with a multilayer reflective film for EUV lithography according to the invention. The inventive reflective mask blank 1 for EUV lithography may further include a thin film for the patterning of the absorber film 16, for example, a resist film 19 for electron beam drawing, on the absorber film 16. That is, the inventive reflective mask blank 1 for EUV lithography may have a structure in which a prescribed absorber film 16 and a prescribed resist film 19 for electron beam drawing are disposed on the multilayer reflective film 12 of the inventive substrate with a multilayer reflective film for EUV lithography.

In the method for producing a reflective mask blank 1 of the invention, it is preferable that the absorber film 16 is formed in the absorber film formation step such that the absorber film does not cover the slope region 90. When the fiducial marks 80 have been formed in the slope region 90, the formation of the absorber film 16 on the fiducial marks 80 may cause the fiducial marks 80 to be deformed. Thus, the absorber film 16 is advantageously formed in such a manner that the absorber film does not cover the slope region 90 in which the fiducial marks 80 have been formed. In this manner, the absence of the absorber film on the slope region 90 allows the fiducial marks to maintain high contrast in relation to the substrate with a multilayer reflective film when the fiducial marks are detected with defect inspection light and electron beam. In order to avoid cover the slope region 90 by the absorber film 16, a sputtering method is performed for forming the absorber film 16 with the aforementioned shielding member arranged in a position opposed to the slope region 90.

In the inventive method for producing a reflective mask blank 1 described above, the fiducial marks 80 are formed in the multilayer reflective film 12 before the formation of the absorber film 16. In an inventive method for the production of a reflective mask blank 1 described below, the formation of the fiducial marks 80 may take place after the absorber film 16 is formed on the multilayer reflective film 12.

When fiducial marks 80 are formed after forming an absorber film 16 on a multilayer reflective film 12 or on a protective film 13, a reflective mask blank 1 having prescribed fiducial marks 80 may be produced in accordance with the following procedures. First, a multilayer reflective film 12 is formed in the aforementioned manner such that a slope region 90 will be formed (a multilayer reflective film formation step). Next, an absorber film 16 is formed on the multilayer reflective film 12 of the substrate with a multilayer reflective film or on a protective film 13 (an absorber film formation step). Thereafter, at least a portion of the multilayer reflective film 12 is removed so as to form fiducial marks 80 in the slope region 90, the fiducial marks serving as references for a defective location indicated by defect information with respect to the surface of the substrate with a multilayer reflective film (a fiducial mark formation step). The formation of the absorber film 16 may take place except on the slope region 90 of the multilayer reflective film 12. In this case, specifically, a peripheral portion of the substrate 11 supports only the slope region 90 of the multilayer reflective film 12, and thus the fiducial marks 80 may be formed by removing the multilayer reflective film 12 alone. In the case there is the absorber film 16 on regions where the formation of the fiducial marks 80 will be formed, the absorber film 16 in such regions is necessarily removed during the process in which at least a portion of the multilayer reflective film 12 is removed for forming the fiducial marks 80.

In this case in which the fiducial marks 80 are formed after the absorber film 16 is formed on the multilayer reflective film 12, it is similarly preferable that the fiducial marks 80 are formed in the fiducial mark formation step by removing at least a portion of the multilayer reflective film 12 by etching or with focused ion beam 64.

Further, fiducial marks 80 may be formed in an absorber film 16 disposed on a multilayer reflective film 12 or on a protective film 13 according to an inventive method for producing a reflective mask blank 1 described below. First, a multilayer reflective film 12 is formed on a principal surface of a substrate 11 in the aforementioned manner to prepare a substrate with a multilayer reflective film (a preparation step of substrate with a multilayer reflective film). Next, an absorber film is formed on the multilayer reflective film 12 of the substrate with a multilayer reflective film or on a protective film 13 in such a manner that the absorber film has a slope region 90 in which the film thickness is decreased in a direction from the inside to the outside of the substrate on a peripheral portion of the principal surface (an absorber film formation step). Thereafter, fiducial marks 80 are formed in the slope region 90 by removing at least a portion of the absorber film 16, the fiducial marks serving as references for a defective location indicated by defect information with respect to the surface of the reflective mask blank or defect information with respect to the surface of the substrate with a multilayer reflective film (a fiducial mark formation step). The multilayer reflective film 12 may be formed in the aforementioned manner such that it has a slope region 90.

For the formation of the formation of the fiducial marks 80, the absorber film 16 alone may be removed, or the absorber film 16, the protective film 13 and the multilayer reflective film 12 may be removed. In this case, the process does not necessarily require removing all the layers of the multilayer reflective film 12 if sufficient contrast can be obtained without processing all the layers of the multilayer reflective film 12.

In the fiducial mark formation step, it is preferable that the fiducial marks 80 are formed by removing at least a portion of the absorber film 16 by etching or with focused ion beam 64.

By utilizing the fiducial marks 80 formed as described above in defect inspection, the information of defective locations in the reflective mask blanks 1 and the substrate with the multilayer reflective film may be accurately grasped and stored.

When the fiducial marks 80 are formed after the formation of the absorber film 16, there are no fiducial marks 80 formed at the stage where the structure is in the form of a substrate with a multilayer reflective film. In this case, defect inspection in the reflective mask blank 1 and defect coordinate control with reference to the fiducial marks 80 may be performed in the following manner.

First, a substrate with a multilayer reflective film having a multilayer reflective film 12 on a substrate 11 is inspected for defects with a defect inspection apparatus with reference to the center of a principal surface 71 of the substrate as a reference point. Through this defect inspection, defects and information on the locations thereof are obtained. Next, a protective film 13 and an absorber film 16 are formed on the multilayer reflective film 12, and thereafter fiducial marks 80 are formed at prescribed positions in the absorber film. Thus, a reflective mask blank 1 with the fiducial marks 80 is obtained.

Next, the reflective mask blank 1 is inspected for defects with a defect inspection apparatus with reference to the fiducial marks 80. Since the absorber film 16 is disposed on the multilayer reflective film 12 as mentioned above, this defect information (defect map) reflects the results of defect inspection with respect to the substrate with a multilayer reflective film obtained above. Based on this fact, the defect information (defect map) of the substrate with a multilayer reflective film and the defect information (defect map) of the reflective mask blank 1 are compared to each other based on any agreement between a defect in the substrate with a multilayer reflective film and a defect in the reflective mask blank 1. In this manner, it is possible to obtain the defect information (defect map) of the substrate with a multilayer reflective film and the defect information (defect map) of the reflective mask blank with reference to the fiducial marks 80.

Another aspect of the invention resides in a method for producing a reflective mask 2 which includes a pattern forming step of patterning an absorber film 16 of a reflective mask blank 1 produced by any of the aforementioned production methods. FIG. 2 is a schematic sectional view illustrating an exemplary configuration of a reflective mask 2 according to the invention. The inventive method for producing a reflective mask 2 will be described with reference to FIG. 3.

FIG. 3(a) illustrates an exemplary configuration of a reflective mask blank 1 obtained by any of the aforementioned inventive production methods. This reflective mask blank 1 includes a glass substrate 11 and, stacked thereon in the order named, a multilayer reflective film 12, a protective film 13, an exposure light absorbing layer 14, and a low reflectance layer 15 that has a low reflectance to inspection light. Further, fiducial marks 80 are disposed in a slope region of the multilayer reflective film 12. The reflective mask blank 1 may further include a resist film 19 (FIG. 3(b)).

Next, an absorber film 16 composed of the exposure light absorbing layer 14 which is an absorber for EUV light 31 and the low inspection light reflectance layer 15 is processed so as to form a prescribed absorber film pattern 22. In a usual embodiment, a resist film 19 for electron beam drawing is applied and formed on the surface of the absorber film 16 to produce a resist-coated reflective mask blank 1 (FIG. 3(b)). Next, a prescribed pattern is drawn in the resist film 19 for electron beam drawing and is developed to form a prescribed resist pattern 21 (FIG. 3(c)). Next, the absorber film 16 is etched while using the resist pattern 21 as a mask, and finally the resist pattern 21 is removed, resulting in a reflective mask 2 having an absorber film pattern 22 (FIG. 3(d)). In this embodiment, the absorber film 16 is a stack composed of the exposure light absorbing layer 14 which is an absorber for EUV light 31 and the low reflectance layer 15 which is an absorber for mask pattern inspection light. The exposure light absorbing layer 14 and the low reflectance layer 15 may be both composed of a material containing tantalum (Ta) as a main component. In the step of etching the absorber film 16, it is preferable that the layers constituting the absorber film 16 have an etching rate ratio in the range of 0.1 to 10 as measured when the layers are dry etched with an identical etching gas. With this configuration, the etching of the tantalum-based absorber film 16 in the form of a stack may be controlled in an improved manner. As a result, the in-plane uniformity of properties such as the pattern line width and the degree of damages to the protective film 13 may be enhanced.

In the invention, the etching gas used in the dry etching of the absorber film 16 in the form of a stack is most suitably a fluorine (F)-containing gas. When the dry etching of the tantalum-based absorber film 16 in the form of a stack is performed with a fluorine (F)-containing gas, the ratio of the etching rates of the layers in the absorber film 16 may be advantageously controlled in the aforementioned preferred range.

Examples of the fluorine (F)-containing gases include $CF_4$, $CHF_3$, $C_2F_6$, $C_3F_6$, $C_4F_6$, $C_4F_8$, $CH_2F_2$, $CH_3F$, $C_3F_8$, $SF_6$ and $F_2$. These fluorine-containing gases may be used singly, or two or more kinds of these fluorine-containing gases may be used as a mixed gas. Further, the gas(es) may be used in the form of a mixture with other gases, for example, a rare gas such as argon (Ar), and chlorine ($Cl_2$) gas.

In an embodiment, one of the exposure light absorbing layer 14 and the low reflectance layer 15 constituting the absorber film 16 may include a material containing tantalum (Ta), boron (B) and oxygen (O), and the other layer may include a material containing tantalum (Ta), boron (B) and nitrogen (N). In this case, the absorber film 16 may be dry etched with a fluorine-containing gas while the ratio of the etching rates of these layers constituting the absorber film 16 is controlled to be in the range of 0.15 to 5.0.

The etching of the absorber film 16 may be controlled in an improved manner by, for example, dry etching the tantalum-based absorber film 16 in the form of a stack with a fluorine-containing gas while the ratio of the etching rates of the layers constituting the absorber film 16 is controlled to the range of 0.1 to 10. Further, this control minimally suppresses damages to the layers under the absorber film by the etching of the absorber film 16.

After the absorber film 16 is etched as described above, the remaining resist pattern 21 is removed by a method such as oxygen ashing.

In the formation of the absorber film 16, the position of the area in which the absorber film pattern 22 will be formed may be adjusted based on the defective location information stored during the defect inspection with respect to the substrate with a multilayer reflective film or the reflective mask blank 1, such that the defects will be hidden under the absorber film pattern 22. As a result, the resultant reflective mask 2 may be used in the projection of exposure light onto a semiconductor substrate while preventing adverse effects because of the defects.

When the reflective mask 2 fabricated as described above is irradiated with EUV light 31, the EUV light 31 is partly absorbed by the absorber film 16 on the surface of the mask and is partly reflected by the protective film 13 and the multilayer reflective film 12 that have been exposed as a result of the removal of the absorber film 16 (see FIG. 3(d)). In this manner, the reflective mask 2 may be used in lithography with EUV light 31.

The reflective mask 2 obtained by the inventive reflective mask 2 production method may be used in the manufacturing of semiconductor devices to lithographically transfer a transfer pattern onto a resist film disposed on a semiconductor substrate. With use of the reflective mask 2, a transfer pattern may be lithographically transferred onto a resist film on a semiconductor substrate and thereby a semiconductor device having a highly accurate pattern may be manufactured.

EXAMPLES

Hereinbelow, embodiments of the present invention will be described in further detail by presenting Examples.

Example 1

A $SiO_2$—$TiO_2$ glass substrate 11 (a 6 inch square [152.4 mm×152.4 mm], thickness 6.3 mm) was used as a substrate 11 in Example 1. The glass substrate 11 was mechanically polished. Consequently, the glass substrate 11 attained a smooth surface with a surface roughness Rms (root mean squared roughness) of 0.15 nm (measurement area: 1 μm×1 μm, measured with an atomic force microscope) and a degree of flatness of not more than 0.05 μm.

Next, a periodic Mo film/Si film multilayer reflective film 12 was formed on a principal surface 71 of the substrate 11, thereby fabricating a substrate with a multilayer reflective film of Example 1.

In detail, 40 cycles each consisting of a Si film (4.2 nm) and a Mo film (2.8 nm) were stacked on top of one another by an ion beam sputtering method on a principal surface 71 of the substrate 11, thereby forming a periodic Mo film/Si film multilayer reflective film 12 (total film thickness 280 nm). The formation of the multilayer reflective film 12 was formed with a shielding member 68 illustrated in FIG. 11 to ensure that a slope region 90 would be formed on a peripheral portion of the substrate 11. The shielding length L of the shielding member 68 was 1.3 mm, and the height h from the principal surface 71 of the substrate 11 to the shielding member 68 was 0.3 mm. This arrangement resulted in a slope region 90 having a width Dslope of 2.5 mm. In the formation of the periodic Mo film/Si film multilayer reflective film 11, Si particles were sputtered at an incident angle of 5 degrees and Mo particles were sputtered at an incident angle of 65 degrees relative to the normal to the principal surface 71 of the substrate 11.

Further, a protective film 13 (2.5 nm) of RuNb (Ru: 80 at %, Nb: 20 at %) was formed on the periodic Mo film/Si film multilayer reflective film 12. Thus, a substrate with a multilayer reflective film of Example 1 was obtained.

In the slope region 90 of the substrate with a multilayer reflective film of Example 1, fiducial marks 80 having a shape shown in FIG. 6(a) were formed in three locations with focused ion beam 64. The conditions in this process were an accelerating voltage of 50 kV and a beam current of 20 pA. In order to form fine marks 82 and auxiliary marks 84, the multilayer reflective film 12 in the slope region 90 was removed until the principal surface 71 of the glass substrate 11 was exposed. The fine mark 82 was a 5 μm×5 μm square, and the paired auxiliary marks 84 were 1 μm×200 μm rectangles. In Example 1, the formation of the fiducial marks 80 took 40 minutes per location.

The fine marks 82 of the fiducial marks 80 were scanned with defect inspection light (wavelength: 193 nm) and electron beam, and the detected reflection intensities of the defect inspection light and the electron beam were measured, thereby obtaining contrasts. The contrasts with the defect inspection light and the electron beam were determined from Contrast=(Imax−Imin)/(Imax+Imin) wherein Imin is the intensity of the defect inspection light or the electron beam detected at the bottom (glass) of the fine marks 82 and Imax is the intensity of the defect inspection light or the electron beam detected at the multilayer reflective film.

The above contrast measurement resulted in a contrast of 0.53 for the defect inspection light and a contrast of 0.023 for the electron beam. These high contrasts showed that the fine marks 82 were detectable by scanning with the defect inspection light and the electron beam.

Example 2

A substrate with a multilayer reflective film which included a multilayer reflective film 12 having a slope region 90 was fabricated in the same manner as in Example 1.

In the slope region 90 of the substrate with a multilayer reflective film similar to that of Example 1, fiducial marks 80 having a shape shown in FIG. 1(a) were formed in three locations by photolithography using an etching technique. Thus, a substrate with a multilayer reflective film of Example 2 was obtained. The fine mark 82 was a 5 μm×5 μm square, and the paired auxiliary marks 84 were 1 μm×200 μm rectangles. In the photolithography, a resist film with a thickness of 400 nm was formed by a spin coating method. The protective film 13 and the multilayer reflective film 12 were removed using a resist pattern 21 as a mask under etching conditions in which the etching gas was $CF_4$ gas and the pressure was 50 mTorr. The formation of the fiducial marks 80 took 5 minutes per location by photolithography.

Contrast measurement was performed in the same manner as in Example 1, resulting in a contrast of 0.52 for the defect inspection light and a contrast of 0.023 for the electron beam. These high contrasts showed that the fine marks 82 were detectable by scanning with the defect inspection light and the electron beam.

Comparative Example 1

A substrate with a multilayer reflective film was fabricated in the same manner as in Example 1, except that the multilayer reflective film 12 was formed on the principal surface 71 of the substrate 11 without using the shielding member 68 during the formation of the multilayer reflective film 12. Consequently, the substrate with a multilayer reflective film of Comparative Example 1 did not have any slope region 90 in the multilayer reflective film 12.

In the substrate with a multilayer reflective film of Comparative Example 1, fiducial marks 80 having a shape shown in FIG. 6(a) were formed at the same three locations as the fiducial marks 80 in Example 1 with focused ion beam 64. The conditions in this process were an accelerating voltage of 50 kV and a beam current of 20 pA. In order to form fine marks 82 and auxiliary marks 84, the multilayer reflective film 12 was removed until the principal surface 71 of the glass substrate 11 was exposed. The fine mark 82 was a 5 μm×5 μm square, and the paired auxiliary marks 84 were 1 μm×200 μm rectangles. The positions of the fiducial marks 80 were the same as the fiducial marks 80 in Example 1. In Comparative Example 1, the formation of the fiducial marks 80 took 80 minutes per location.

Contrast measurement was performed in the same manner as in Example 1, resulting in a contrast of 0.55 for the defect inspection light and a contrast of 0.023 for the electron beam. These high contrasts showed that the fine marks 82 were detectable by scanning with the defect inspection light and the electron beam. However, the time required for forming the fiducial marks 80 in Comparative Example 1 was doubled compared to Example 1.

To reduce the time of the processing of fiducial marks 80, fiducial marks 80 were formed by processing a half of the 280 nm thick multilayer reflective film 12, namely, to a depth of 140 nm with focused ion beam 64. In this case, the contrast with the electron beam was decreased by 30% compared to that in Comparative Example 1 in which the multilayer reflective film 12 was removed until the principal surface 71 of the glass substrate 11 was exposed. As a result, the contrast was insufficient for the detection of the fiducial marks 80.

(Fabrication of Reflective Mask Blanks of Example 1, Example 2 and Comparative Example 1)

The substrate with the multilayer reflective film of Example 1, Example 2 and Comparative Example 1 were subjected to magnetron sputtering to form a back surface conductive film 18 on a principal surface 71 of the substrate 11 opposite to the side with the multilayer reflective film 12.

Specifically, a CrN film containing Cr and N was formed as the back surface conductive film 18 on the glass substrate 11 by a DC magnetron sputtering method. The film deposition by a DC magnetron sputtering method is performed with a Cr target and a sputtering gas which was a mixture of argon (Ar) gas and nitrogen ($N_2$) gas ($Ar:N_2=90\%:10\%$). The conductive film 18 formed had a composition in which Cr represented 90 at % and N represented 10 at %. The film thickness was 20 nm.

Next, an absorber film 16 (a stack of a TaBN film and a TaBNO film) was formed on the protective film 13 by magnetron sputtering the materials onto the protective film 13.

The absorber film 16 was formed in the following manner. First, a TaBN film containing Ta, B and N was formed as an exposure light absorbing layer 14 defining the lower layer in the absorber film 16, on the Ru protective film 13 by a DC magnetron sputtering method. Specifically, a TaBN film was formed by a DC magnetron sputtering method using a target containing Ta and B (Ta:B=80 at %:20 at %) and a mixed gas containing xenon (Xe) gas and nitrogen ($N_2$) gas (Xe: $N_2=90\%:10\%$). The TaBN film that was formed had a composition of Ta 80 at %, B 10 at % and N 10 at %. The film thickness was 56 nm.

Next, a TaBNO film containing Ta, B, N and O was formed as a low reflectance layer 15 on the exposure light absorbing layer 14 by a DC magnetron sputtering method. Specifically, a TaBO film was formed by a DC magnetron sputtering method using a target containing Ta and B (Ta:B=80 at %:20 at %) and a mixed gas containing argon (Ar) gas and oxygen ($O_2$) gas ($Ar:N_2:O_2=60\%:15\%:25\%$). The TaBO film formed had a composition of Ta 40 at %, B 10 at %, N 10 at % and O 40 at %. The film thickness was 14 nm. In the manner described above, reflective mask blanks 1 for EUV lithography were obtained which had the absorber film 16 composed of the exposure light absorbing layer 14 and the low reflectance layer 15.

Here, some of the reflective mask blanks 1 were fabricated such that the absorber film 16 did not cover the slope region 90, and others of the reflective mask blanks 1 were produced such that the absorber film 16 covered the slope region 90. With respect to these mask blanks, contrasts with defect inspection light and electron beam at the fine marks 82 were measured.

As a result of the contrast measurement, the reflective mask blanks 1 which included the substrate with the multilayer reflective film of Example 1 and Example 2 had the following contrasts. In the case of the reflective mask blanks 1 in which the absorber film 16 did not cover the slope region 90, both the defect inspection light and the electron beam provided high contrast as they showed with respect to the substrate with the multilayer reflective film. In the case of reflective mask blanks 1 in which the absorber film 16 covered the slope region 90, the contrasts decreased only several %. On the other hand, in the case of the reflective mask blanks 1 which included the substrate with the multilayer reflective film of Comparative Example 1 and in which the absorber film 16 covered the slope region 90, the contrasts decreased 30% in both cases of the defect inspection light and the electron beam.

Example 3

A substrate with a multilayer reflective film which included a multilayer reflective film 12 having a slope region 90 was fabricated in the same manner as in Example 1. Next, a back surface conductive film 18 was formed on a principal surface 71 of the substrate 11 opposite to the side with the multilayer reflective film 12, and an absorber film 16 was formed on the protective film 13 by the same methods as in the fabrication of reflective mask blanks in Examples 1 and 2. In this manner, reflective mask blanks 1 for EUV lithography were obtained.

The absorber film 16 was formed so as to cover the multilayer reflective film 12 and the protective film 13 disposed in the slope region 90. The formation of the absorber film 16 was performed by a DC magnetron sputtering method with a shielding member 68 illustrated in FIG. 11.

As a result, the slope region 90 of the multilayer reflective film 12 and the absorber film 16 had a width Dslope of 2.5 mm.

Next, fiducial marks 80 (fine marks 82 and auxiliary marks 84) having the same size and shape as in Example 1 were formed with focused ion beam 64 in the same three locations as in Example 1. The conditions in this process were an accelerating voltage of 50 kV and a beam current of 20 pA. In order to form the fine marks 82 and the auxiliary marks 84, the absorber film 16 in the slope region 90 was removed until the protective film 13 was exposed. In Example 3, the formation of the fiducial marks 80 took 10 minutes per location.

Contrast measurement was performed in the same manner as in Example 1, resulting in a contrast of 0.42 for the defect inspection light and a contrast of 0.020 for the electron beam. These high contrasts showed that the fine marks 82 were detectable by scanning with the defect inspection light and the electron beam.

(Fabrication of Reflective Masks 2 for EUV Lithography of Example 1, Example 2, Example 3 and Comparative Example 1)

Next, the reflective mask blanks 1 for EUV lithography of Example 1, Example 2, Example 3 and Comparative Example 1 produced as described above were processed, were used to produce EUV exposure reflective masks 2 of Example 1, Example 2, Example 3 and Comparative Example 1 which had patterns for the manufacturing of DRAM with a design of 22 nm rule half pitch in the following manner.

First, a resist film 19 for electron beam drawing (120 nm) was formed on the reflective mask blank 1 and was subjected to electron beam drawing and development. Thus, a prescribed resist pattern 21 was formed.

The absorber film 16 in the form of a stack was dry etched using this resist pattern 21 as a mask with an ICP (inductively coupled plasma) dry etching apparatus, thereby forming an absorber film pattern 22 serving as a transfer pattern in the absorber film 16. This process is performed with a mixed gas of $CHF_3$ gas and Ar gas as the etching gas, and the dry etching of the absorber film 16 was performed with appropriately controlling the ratio of the flow rates of the $CHF_3$ gas and the Ar gas, and the gas pressure, the ICP power and the bias during the dry etching.

Next, the Ru protective film 13 on the reflective regions (the regions where no absorber film pattern 22 is formed) was removed by dry etching in accordance with the absorber film pattern 22 using a mixed gas of chlorine ($Cl_2$) and oxygen ($O_2$) (the chlorine ($Cl_2$):oxygen ($O_2$) mixing ratio (flow rate ratio) was 8:2), and thereby the multilayer reflective film 12 was exposed. In the manner described above, reflective masks 2 of Example 1, Example 2, Example 3 and Comparative Example 1 were obtained.

With a mask tester, the reflective masks 2 of Example 1, Example 2, Example 3 and Comparative Example 1 were subjected to a final check test. The patterns for the manufacturing of DRAM with a design rule of 22 nm a half pitch had been produced as designed in the reflective masks 2 of Example 1, Example 2 and Example 3. The reflectance of the reflective regions with respect to EUV light 31 was 63.5%, which was the same as the value measured on the substrate with the multilayer reflective film. In contrast, in the case of the reflective mask 2 of Comparative Example 1, the designed formation of patterns for the manufacturing of DRAM with the design rule of 22 nm a half pitch was failed.

(Transfer with Exposure Light using Reflective Masks 2 of Example 1, Example 2, Example 3 and Comparative Example 1)

Figure 4:
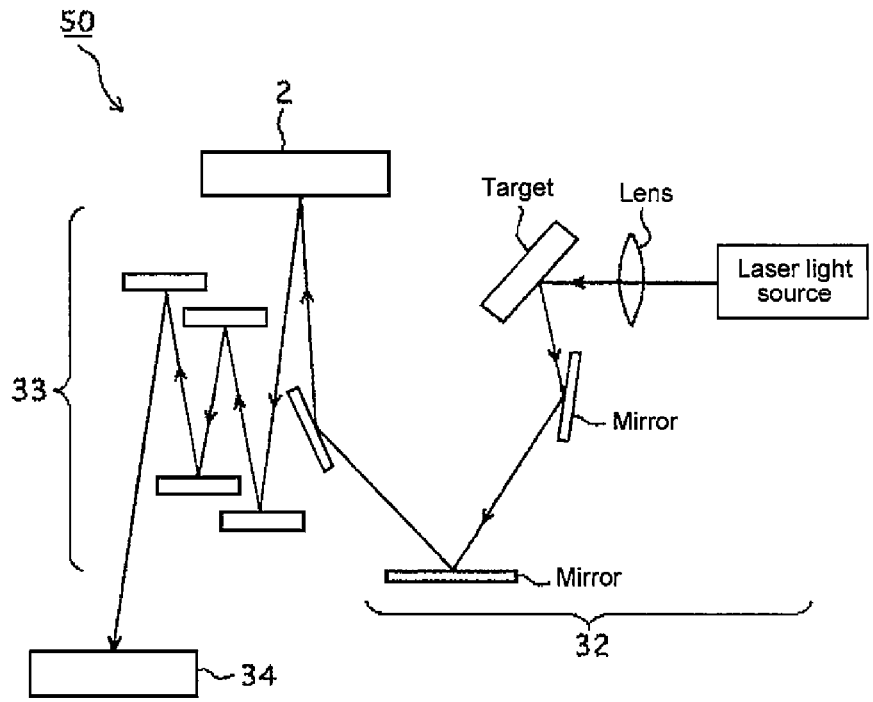
FIG. 4 is a schematic view illustrating a general configuration of a pattern transfer apparatus on which a reflective mask is mounted.

With use of the reflective masks 2 of Example 1, Example 2, Example 3 and Comparative Example 1, transfer by EUV light 31 was performed onto semiconductor substrates 34 with a pattern transfer apparatus 50 illustrated in FIG. 4.

The pattern transfer apparatus 50, on which the reflective mask 2 was mounted, was generally composed of a laser plasma X-ray source 32 and a demagnification optical system 33. The demagnification optical system 33 included X-ray reflective mirrors. The demagnification optical system 33 was configured to demagnify the pattern reflected by the reflective mask 2 to a size about ¼ of the original. The wavelength range of 13 to 14 nm was used as the exposure wavelength, and the optical path was set beforehand so as to be in vacuum.

After this setting, the EUV light 31 emitted from the laser plasma X-ray source 32 was caused to be incident on the reflective mask 2 and the reflected light was transferred onto the silicon wafer (a resist-coated semiconductor substrate) 34 through the demagnification optical system 33.

The patterns were transferred onto the semiconductor substrates as described above. As a result, the reflective masks 2 of Example 1, Example 2 and Example 3 sufficiently satisfied the accuracy requirement of the design rule of 22 nm a half pitch. However, the reflective mask 2 of Comparative Example 1 failed to satisfy the accuracy requirement of the design rule of 22 nm a half pitch to a sufficient extent.

REFERENCE SIGNS LIST

1 Reflective mask blank
2 Reflective mask
11 Substrate (Glass substrate)
12 Multilayer reflective film
13 Protective film
14 Exposure light absorbing layer
15 Low reflectance layer
16 Absorber film
18 Conductive film
19 Electron beam drawing resist film
21 Resist pattern
22 Absorber film pattern
31 EUV light
32 Laser plasma X-ray source
33 Demagnification optical system
34 Silicon wafer (Resist-coated semiconductor substrate)
50 Pattern transfer apparatus
60 Ion beam sputtering apparatus
61 Ion beam generator
62 Target
63 Rotating stage
64 Focused ion beam
66 Sputtered particles
68 Shielding member
71 Principal surface
72 Side
73 Chamfered edge
74 Corner
80 Reference mark
82 Fine mark
84 Auxiliary mark
90 Slope region
Dslope Width of slope region
α Sputtered particle incident angle

The invention claimed is:

1. A method for producing a substrate with a multilayer reflective film for EUV lithography, the substrate with the multilayer reflective film including a multilayer reflective film disposed on a principal surface of a substrate, the multilayer reflective film including higher refractive index layers and lower refractive index layers alternately stacked on top of one another, the method comprising:

a multilayer reflective film formation step of forming the multilayer reflective film on the principal surface of the substrate in such a manner that the multilayer reflective film has a slope region in which the film thickness is decreased in a direction from the inside to the outside of the substrate on a peripheral portion of the principal surface, and a fiducial mark formation step of forming fiducial marks in the slope region by removing at least a portion of the multilayer reflective film, the fiducial marks serving as references for a defective location indicated by defect information with respect to the surface of the substrate with the multilayer reflective film.

2. The method for producing a substrate with a multilayer reflective film according to claim 1, wherein the fiducial marks are formed in the fiducial mark formation step by removing at least a portion of the multilayer reflective film by etching or with focused ion beam.

3. The method for producing a substrate with a multilayer reflective film according to claim 1, wherein, in the multilayer reflective film formation step, the higher refractive index layers and the lower refractive index layers are formed by a sputtering method such that a shielding member is disposed apart from the peripheral portion, and the higher refractive index layers and the lower refractive index layers are deposited at an angle relative to the normal to the principal surface of the substrate.

4. The method for producing a substrate with a multilayer reflective film according to claim 1, wherein the multilayer reflective film is formed by an ion beam sputtering method.

5. The method for producing a substrate with a multilayer reflective film according to claim 1, wherein the method includes a protective film formation step of forming a protective film on the multilayer reflective film.

6. The method for producing a substrate with a multilayer reflective film according to claim 5, wherein the protective film includes a material containing ruthenium (Ru).

7. A method for producing a reflective mask blank comprising an absorber film formation step of forming an absorber film on the multilayer reflective film of a substrate with a multilayer reflective film obtained by the method for producing a substrate with a multilayer reflective film described in claim 1.

8. The method for producing a reflective mask blank according to claim 7, wherein the absorber film is formed in the absorber film formation step such that the absorber film does not cover the slope region.

9. A method for producing a reflective mask blank, the reflective mask blank including a multilayer reflective film disposed on a principal surface of a substrate and an absorber film disposed on the multilayer reflective film, the multilayer reflective film including higher refractive index layers and lower refractive index layers alternately stacked on top of one another, the method comprising:
a multilayer reflective film formation step of forming the multilayer reflective film on the principal surface of the substrate in such a manner that the multilayer reflective film has a slope region in which the film thickness is decreased in a direction from the inside to the outside of the substrate on a peripheral portion of the principal surface,
an absorber film formation step of forming the absorber film on the multilayer reflective film of the substrate with the multilayer reflective film, and
a fiducial mark formation step of forming fiducial marks in the slope region by removing at least a portion of the multilayer reflective film, the fiducial marks serving as references for a defective location indicated by defect information with respect to the surface of the reflective mask blank or by defect information with respect to the surface of the substrate with the multilayer reflective film.

10. The method for producing a reflective mask blank according to claim 9, wherein the fiducial marks are formed in the fiducial mark formation step by removing at least a portion of the multilayer reflective film by etching or with focused ion beam.

11. A method for producing a reflective mask comprising a pattern forming step of patterning the absorber film of a reflective mask blank produced by the production method described in claim 7.

12. A substrate with a multilayer reflective film for EUV lithography, the substrate with the multilayer reflective film including a multilayer reflective film disposed on a principal surface of a substrate, the multilayer reflective film including higher refractive index layers and lower refractive index layers alternately stacked on top of one another, wherein the multilayer reflective film comprises:
a slope region in which the film thickness is decreased in a direction from the inside to the outside of the substrate on a peripheral portion of the principal surface, and
fiducial marks formed in the slope region by removing at least a portion of the multilayer reflective film, the fiducial marks serving as references for a defective location indicated by defect information with respect to the surface of the substrate with the multilayer reflective film.

13. The substrate with the multilayer reflective film according to claim 12, wherein the substrate with the multilayer reflective film includes a protective film on the multilayer reflective film.

14. The substrate with the multilayer reflective film according to claim 13, wherein the protective film has a thickness distribution similar to that of the multilayer reflective film.

15. The substrate with the multilayer reflective film according to claim 12, wherein the fiducial marks are formed such that the positions of fiducial marks are arranged in portions of the slope region in which the film thickness is ⅓ to ½ of the film thickness at the center of the multilayer reflective film.

16. A reflective mask blank for EUV lithography, the reflective mask blank including a multilayer reflective film disposed on a principal surface of a substrate and an absorber film disposed on the multilayer reflective film, the multilayer reflective film including higher refractive index layers and lower refractive index layers alternately stacked on top of one another, wherein the multilayer reflective film comprises:
a slope region in which the film thickness is decreased in a direction from the inside to the outside of the substrate on a peripheral portion of the principal surface, and
fiducial marks formed in the slope region by removing at least a portion of the multilayer reflective film, the fiducial marks serving as references for a defective location indicated by defect information with respect to the surface of the reflective mask blank or by defect information with respect to the surface of the substrate with the multilayer reflective film.

17. The reflective mask blank according to claim 16, wherein the reflective mask blank includes a protective film between the multilayer reflective film and the absorber film.

18. The reflective mask blank according to claim 17, wherein the protective film has a thickness distribution similar to that of the multilayer reflective film.

19. The reflective mask blank according to claim 16, wherein the fiducial marks are formed such that the positions of fiducial marks are arranged in portions of the slope region in which the film thickness is ⅓ to ½ of the film thickness at the center of the multilayer reflective film.

20. The reflective mask blank according to claim 16, wherein the absorber film is formed such that the absorber film does not cover the slope region.

21. The reflective mask blank according to claim 16, wherein the absorber film is formed such that the absorber film cover the slope region.

* * * * *